(12) United States Patent
Coronel

(10) Patent No.: US 9,236,262 B2
(45) Date of Patent: Jan. 12, 2016

(54) PROCESS FOR PRODUCING A DOUBLE-GATE FIELD-EFFECT DEVICE HAVING INDEPENDENT GATES

(71) Applicant: COMMISSARIAT À L'ENERGIE ATOMIQUE ET AUX ENERGIES ALTERNATIVES, Paris (FR)

(72) Inventor: Philippe Coronel, Barraux (FR)

(73) Assignee: COMMISSARIAT À L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 14/429,153

(22) PCT Filed: Sep. 18, 2013

(86) PCT No.: PCT/FR2013/000246
§ 371 (c)(1),
(2) Date: Mar. 18, 2015

(87) PCT Pub. No.: WO2014/044929
PCT Pub. Date: Mar. 27, 2014

(65) Prior Publication Data
US 2015/0249014 A1    Sep. 3, 2015

(30) Foreign Application Priority Data
Sep. 18, 2012  (FR) ..................... 12 02479

(51) Int. Cl.
*H01L 21/00* (2006.01)
*H01L 21/28* (2006.01)
(Continued)

(52) U.S. Cl.
CPC ...... *H01L 21/28132* (2013.01); *H01L 21/0337* (2013.01); *H01L 21/28141* (2013.01); *H01L 29/401* (2013.01); *H01L 29/66772* (2013.01); *H01L 29/78648* (2013.01)

(58) Field of Classification Search
CPC ............... H01L 21/28132; H01L 21/28141; H01L 21/0337; H01L 29/401
See application file for complete search history.

(56) References Cited

U.S. PATENT DOCUMENTS 5,689,127 A * 11/1997 Chu ................ H01L 29/66666
257/135
6,483,156 B1 * 11/2002 Adkisson .......... H01L 21/76264
257/288

(Continued)

FOREIGN PATENT DOCUMENTS

EP    2 323 160 A1    5/2011
FR    2952472 A1 *   5/2011    ........ H01L 21/76283

(Continued)

OTHER PUBLICATIONS

Nov. 15, 2013 Search Report issued in International Application No. PCT/FR2013/000246.

(Continued)

*Primary Examiner* — Laura Menz
(74) *Attorney, Agent, or Firm* — Oliff PLC

(57) ABSTRACT

A substrate of SOI type is covered by an etching mask defining three distinct semiconductor patterns. A lateral spacer is formed around the three patterns and performs the connection between two adjacent patterns. The buried insulating layer is eliminated so as to define a cavity which suspends a part of a first pattern. The first etching mask is eliminated. A gate dielectric is formed on two opposite main surfaces of the first pattern. The resist is deposited in the cavity and on the first pattern and is then exposed to form two patterns defining the bottom and top gates. An electrically conducting material is deposited in the cavity and on the first pattern so as to form the bottom gate and the top gate on each side of the first semiconductor material pattern.

7 Claims, 4 Drawing Sheets

(51) Int. Cl.
  *H01L 29/66* (2006.01)
  *H01L 29/786* (2006.01)
  *H01L 21/033* (2006.01)
  *H01L 29/40* (2006.01)

(56) References Cited

U.S. PATENT DOCUMENTS

| | | | | |
|---|---|---|---|---|
| 6,580,132 B1 * | 6/2003 | Chan | ............... | H01L 29/4908 257/347 |
| 6,762,101 B2 * | 7/2004 | Chan | ............... | H01L 29/4908 257/E21.415 |
| 6,946,696 B2 * | 9/2005 | Chan | ............... | H01L 21/26533 257/250 |
| 6,967,377 B2 * | 11/2005 | Cohen | ............... | H01L 27/1203 257/347 |
| 7,163,864 B1 * | 1/2007 | Adkisson | ............... | H01L 29/42384 257/347 |
| 7,187,042 B2 * | 3/2007 | Bryant | ............... | H01L 29/42368 257/401 |
| 7,202,117 B2 * | 4/2007 | Orlowski | ............... | H01L 29/42392 257/57 |
| 7,476,946 B2 * | 1/2009 | Bryant | ............... | H01L 29/42368 257/401 |
| 7,659,579 B2 * | 2/2010 | Anderson | ............... | H01L 29/66772 257/343 |
| 7,718,489 B2 * | 5/2010 | Anderson | ............... | H01L 29/42384 257/E21.623 |
| 7,888,742 B2 * | 2/2011 | Cohen | ............... | H01L 21/28518 257/365 |
| 7,923,315 B2 * | 4/2011 | Pouydebasque | ............... | H01L 29/42392 257/E21.179 |
| 8,557,665 B2 * | 10/2013 | Cohen | ............... | H01L 21/28518 257/E21.421 |
| 8,710,494 B2 * | 4/2014 | Gwoziecki | ............... | H01L 51/0554 257/315 |
| 2002/0153587 A1 * | 10/2002 | Adkisson | ............... | H01L 21/76264 257/510 |
| 2004/0119102 A1 * | 6/2004 | Chan | ............... | H01L 21/26533 257/270 |
| 2005/0196924 A1 * | 9/2005 | Mimura | ............... | H01L 29/42384 438/282 |
| 2007/0080402 A1 * | 4/2007 | Kato | ............... | H01L 29/6675 257/351 |
| 2008/0164528 A1 * | 7/2008 | Cohen | ............... | H01L 21/28518 257/365 |
| 2010/0047984 A1 * | 2/2010 | Cohen | ............... | H01L 21/28518 438/283 |
| 2011/0108942 A1 * | 5/2011 | Fenouillet-Beranger | ............... | H01L 21/76283 257/503 |

FOREIGN PATENT DOCUMENTS

| | | | | |
|---|---|---|---|---|
| FR | EP 2325873 A1 * | 5/2011 | ........ | H01L 29/78648 |
| JP | 2007134366 A * | 5/2007 | | |
| WO | 2004/088757 A1 | 10/2004 | | |

OTHER PUBLICATIONS

Solomon et al; "Two Gates Are Better Than One;" IEEE Circuits and Devices Magazine; vol. 19; No. 1; Jan. 1, 2003; pp. 48-62.

* cited by examiner

PROCESS FOR PRODUCING A DOUBLE-GATE FIELD-EFFECT DEVICE HAVING INDEPENDENT GATES

BACKGROUND OF THE INVENTION

The invention relates to a method for producing a double-gate field-effect device.

STATE OF THE ART

The ever-continuing upgrade of the performances of integrated circuits, for example in terms of consumption and/or operating frequency, is ineluctably resulting in a constant reduction of the size of its components. In order to produce devices with continually improved performances, new architectures and/or new materials have been integrated in the transistors.

Double-gate transistors present numerous advantages compared with transistors called "planar transistors" which only use a single gate. Double-gate transistors enable a better electrostatic control, which makes them better candidates for producing integrated circuits having a gate width of less than 32 nm. However, production of a double-gate transistor is more complicated and leads to additional production constraints.

In obvious manner, a production method has to enable achievement of a strict alignment of the top and bottom gates. Indeed, if these gates are misaligned or dissymmetric, parasitic capacitances then exist which make the device unsuitable for industrial use. With regard to the dimensions of the gates and the available techniques, alignment of the top and bottom gates can only be achieved, in industrial manner, by self-alignment of these two gates. Although formation of the top gate can be achieved simply by conventional techniques, formation of the bottom gate, located under the channel of the device, encounters difficulty of access and requires complex integration methods.

A non-negligible constraint also exists on the independence of the gate electrodes. If the gates are formed simultaneously or independently, the production method must be able to form electrically coupled gates or independent gates.

OBJECT OF THE INVENTION

The object of the invention is to produce a double-gate field-effect device which is easier to achieve and which is compatible with production of independent gates.

The method according to the invention is characterized in that it successively comprises:
providing a substrate successively provided with a support, a layer made from a first material, a layer made from semiconductor material and an etching mask, the semiconductor material layer and the etching mask defining distinct first, second and third patterns,
forming a lateral spacer surrounding each of the three patterns, the lateral spacer making the connection between the first and third patterns,
eliminating the layer of first material so as to suspend at least a part of the first pattern and to define a cavity having an access opening between the first and second patterns,
eliminating the first etching mask,
forming a gate dielectric on two opposite main surfaces of the first pattern made from semiconductor material,
depositing a resist in the cavity and on the pattern made from semiconductor material,
forming, in the resin, a first hole inside the cavity to define a future bottom gate and a second hole defining a future top gate on the first pattern, the resist leaving the access opening to the cavity situated between the first and second patterns free,
forming an electrically conducting material in the cavity and on the first pattern made from semiconductor material so as to form the bottom gate and the top gate on each side of the first pattern made from semiconductor material.

BRIEF DESCRIPTION OF THE DRAWINGS

Other advantages and features will become more clearly apparent from the following description of particular embodiments of the invention given for non-restrictive example purposes only and represented in the appended drawings, in which.

DESCRIPTION OF PREFERRED EMBODIMENTS OF THE INVENTION

Figure 1:
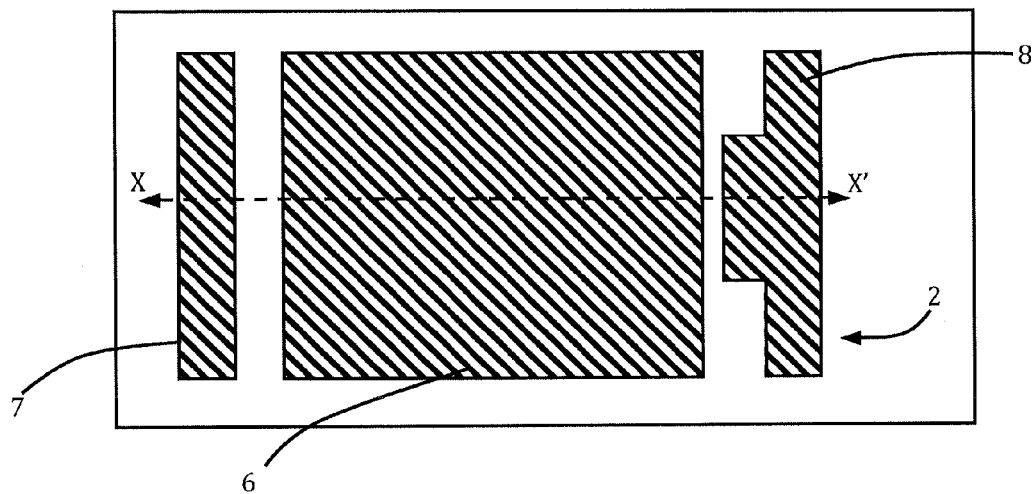
FIGS. 1 to 12 represent, in schematic manner, successive steps of the production method of a double-gate field-effect transistor, in top view and in cross-section.

As illustrated in FIG. 1, the method for producing a field-effect device comprises a first step of providing a substrate 1 one side of which is covered by an etching mask 2 so as to define at least one pattern representative of the part covered by the mask and a pattern representative of the part left uncovered.

Figure 2:
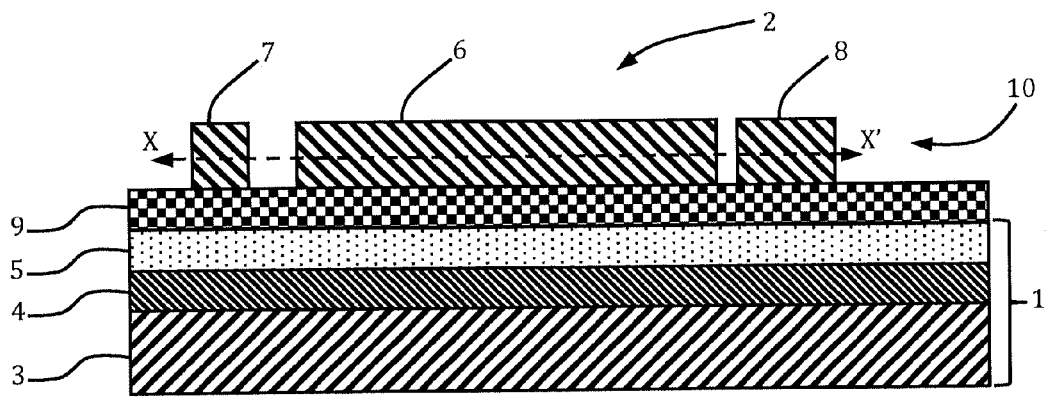

As illustrated in FIG. 2, substrate 1 successively comprises a support 3, a layer 4 made from a first material and a layer 5 made from semiconductor material. The first material of layer 4 is chosen such as to present an etching selectivity with the semiconductor material forming layer 5 and support 3. In advantageous manner, the first material of layer 4 is electrically insulating. Substrate 1 has a main surface covered by first etching mask 2 so that semiconductor material layer 5 separates first etching mask 2 and layer 4.

In advantageous manner, layer 5 is monocrystalline in order to form a field-effect transistor which has good performances and is reproducible. Etching mask 2 can be made from any suitable material, advantageously by means of any material which presents an etching selectivity with respect to the semiconductor material. The material forming etching mask 2 can be a silicon oxide, a silicon nitride, or a silicon-germanium alloy. In an alternative embodiment, etching mask 2 can be formed by a sacrificial part of layer 5.

In a particular embodiment, substrate 1 is of semiconductor on insulator type. Substrate 1 successively comprises a support 3, an electrically insulating layer 4 and a semiconductor material layer 5 covered by first etching mask 2. Electrically insulating layer 4 can be formed by a single material or by a stack of several layers of different materials. For example, layer 4 can be formed by a silicon oxide, a silicon nitride or a stack of ONO type, ONO standing for silicon Oxide/Nitride/Oxide. For example, support 3 is formed by a monocrystalline silicon layer.

First etching mask 2 defines three distinct patterns 6, 7, and 8 at the surface of substrate 1. In a particular embodiment, first pattern 6 separates second pattern 7 and third pattern 8. These three patterns are aligned, i.e. an axis XX' passes through the three patterns.

First pattern 6 defines the active area on which the field-effect transistor will be formed in semiconductor material layer 5. Second pattern 7 and third pattern 8 are two patterns distinct from first pattern 6.

As indicated in the foregoing, first etching mask 2 defines two complementary designs, a first design which corresponds to what is covered by first etching mask 2 and a complementary second design which corresponds to what is left uncovered by first etching mask 2.

In a particular embodiment, first etching mask 2 is formed by a resin. In another embodiment, first mask 2 is made in a sacrificial layer 9 which is etched by means of an intermediate mask 10. Intermediate mask 10 is formed for example in a resist and sacrificial layer 9 is chosen from a stronger material for the remainder of the method.

For example, sacrificial layer 9 is formed from a material which can be selectively etched with respect to semiconductor material layer 5 and if applicable with respect to other materials present on or in substrate 1. Sacrificial layer 9 can be formed by an electrically conducting or electrically insulating material. For example, sacrificial layer 9 is made from silicon oxide, silicon nitride or a silicon-germanium alloy advantageously in multicrystalline form.

Figure 3:
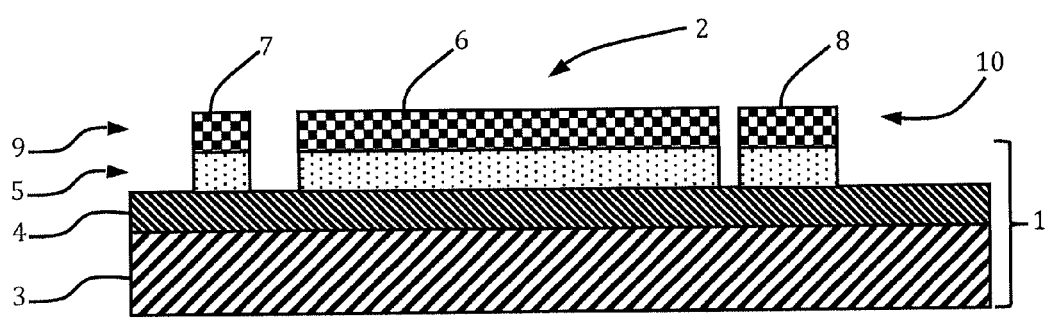

As illustrated in FIG. 3, once sacrificial layer 9 has been etched with respect to intermediate mask 10, sacrificial layer 9 forms first mask 2. First etching mask 2 can be of any thickness provided that it enables the different patterns required in layer 5 and in layer 4 to be defined before being eliminated. First etching mask 2 preferably has a thickness of about a few hundred nanometres. Once layer 5 has been etched, the designs defined in first etching mask 2 are identical or substantially identical to the designs defined in layer 5.

In other words, semiconductor material layer 5 is etched with respect to first mask 2 so as to define a substantially similar design to that of first mask 2, at the surface of electrically insulating layer 4. In this way, first pattern 6, second pattern 7 and third pattern 8 are defined in semiconductor material layer 5.

In another example case, substrate 1 is directly provided with the different layers, i.e. successively comprises support 3, first material layer 4, semiconductor material layer 5 and etching mask 2. Semiconductor material layer 5 and etching mask 2 define the three distinct patterns 6, 7, 8.

Figure 4:
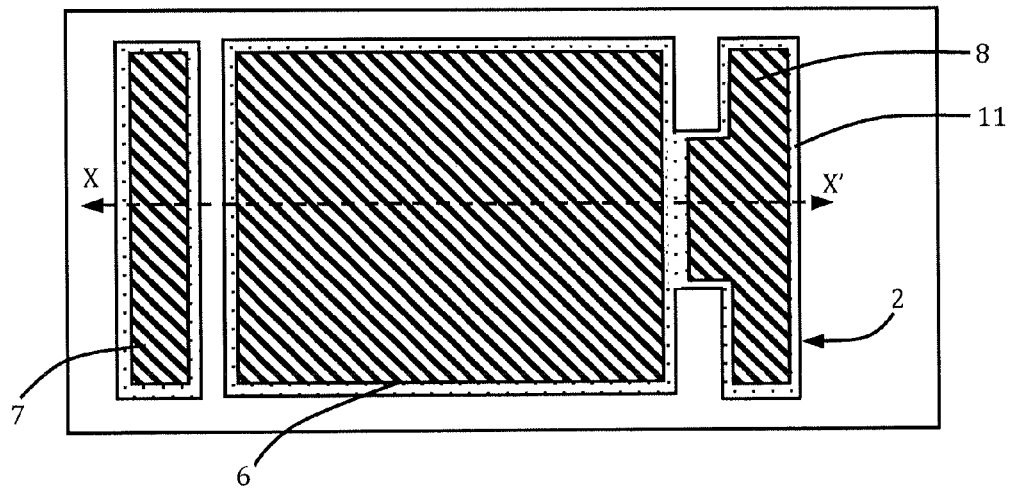
Figure 5:
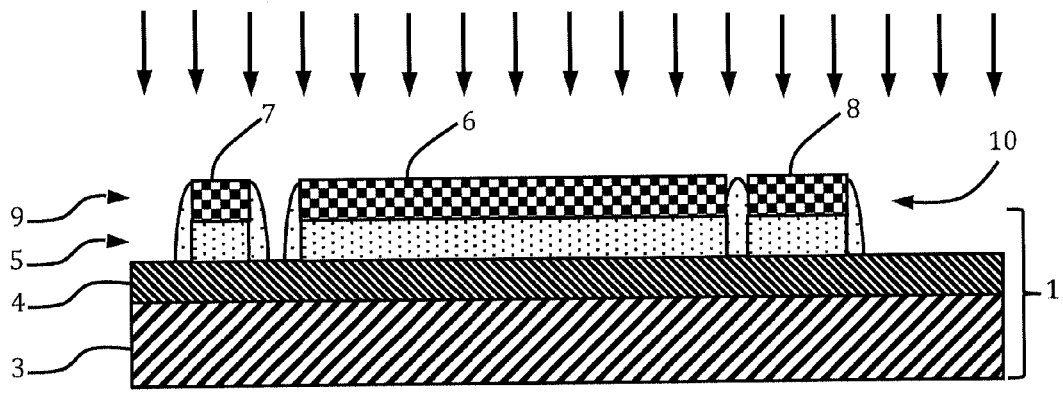

As illustrated in FIGS. 4 and 5, a lateral spacer 11 is formed around first pattern 6, second pattern 7 and third pattern 8 on electrically insulating layer 4.

A part of the space between first pattern 6 and third pattern 8 is filled by the material forming spacer 11. The space between first pattern 6 and second pattern 7 comprises an area that is not filled by the material forming lateral spacer 11. In other words, lateral spacer 11 performs the connection between first pattern 6 and third pattern 8.

In an advantageous embodiment, spacer 11 does not make a connection between first pattern 6 and second pattern 7.

By means of a judicious choice in the dimensions separating the first pattern from the second pattern and the first pattern from the third pattern, the two spaces between the first pattern and the two adjacent patterns are in opposite states (i.e. uncovered or covered). This specificity subsequently enables an asymetric work to define and access the future top and bottom gate electrodes.

According to the dimensions of the devices and to the distance separating the devices, it may be advantageous to provide an etch stop pattern which crosses first material layer 4. For example, electric insulation patterns can surround the future field-effect transistors and these insulation patterns can be made from or contain a material that is insensitive or more resistant to an etching agent of the material forming layer 4. It is also possible to define the area to be etched by implanting a particular species which will enable the implanted layer 4 to be more easily etched. In another embodiment, using a photography of opposite polarity, the implanted species enables the material of layer 4 to be made insensitive or less sensitive to the etching agent.

Spacer 11 can be formed by any suitable technique, for example by means of deposition of a material which covers the whole of the surface. This material is then etched in anisotropic manner by means of a new etching mask so as to define a lateral spacer 11 around the different patterns 6, 7 and 8, the lateral spacer making the connection between first pattern 6 and third pattern 8. The use of an additional etching mask no longer enables a self-aligned process to be obtained.

In a particularly advantageous embodiment, the minimum distance separating first pattern 6 and third pattern 8 is less than twice the width of lateral spacer 11. In this way, lateral spacer 11 formed around third pattern 8 comes into contact with lateral spacer 11 formed around first pattern 6.

In advantageous manner, lateral spacer 11 is formed by means of conformal deposition of a first material followed by anisotropic etching directed essentially in perpendicular manner to the main surface of the substrate of this first material (direction of the arrows in FIG. 5). This embodiment is particularly advantageous as the material which fills the space between the first pattern and the third pattern is self-aligned. The connection between patterns 6 and 8 is defined solely by means of the distance between the two patterns and the thickness of the spacers, which is easy to implement. This embodiment avoids having to use an additional etching mask to form a spacer which passes round the different patterns. However, it may be necessary to use an additional mask to eliminate the connection between first pattern 6 and second pattern 7. In other words, if the space between first pattern 6 and second pattern 7 is filled, an additional step of photolithography associated with etching is performed to access electrically insulating layer 4.

In advantageous manner, the minimum distance between first pattern 6 and second pattern 7 defined by first etching mask 2 is more than twice the width of lateral spacer 11. There is therefore no connection between first pattern 6 and second pattern 7 after the anisotropic etching step and it is not necessary to use an additional etching mask.

In a particular embodiment, lateral spacer 11 is formed by two successive materials which have been deposited and then etched. There is then deposition and then anisotropic etching of a first spacer material to form a first spacer and then deposition and anisotropic etching of a second spacer material to finalise the dimensions of lateral spacer 11. The use of two successively structured spacer materials makes for a greater flexibility in the choice of the deposition and etching conditions to form a lateral spacer which fills the space between first pattern 6 and third pattern 8.

The use of a lateral spacer 11 formed by two successively deposited and etched materials enables a height difference to be imposed between the connection existing between first pattern 6 and third pattern 8 and the part of lateral spacer 11 which is arranged between first pattern 6 and second pattern 7.

Formation of a lateral spacer without using an additional etching mask can be achieved by any suitable technique. For example, if lateral spacer 11 is made from silicon nitride, etching of the silicon nitride can be performed by $CH_3F$—base ion etching.

In the particular embodiment illustrated in FIG. 4, third pattern 8 presents a variable dimension along the axis XX' so as to define a connection surface with the first pattern which is smaller than the facing surface between the two patterns 6 and 8. The same can be the case for first pattern 6. In this example case, there is a part of the two patterns which is connected and a part which is devoid of connection. This particular shape facilitates formation of the future contact.

Figure 6:
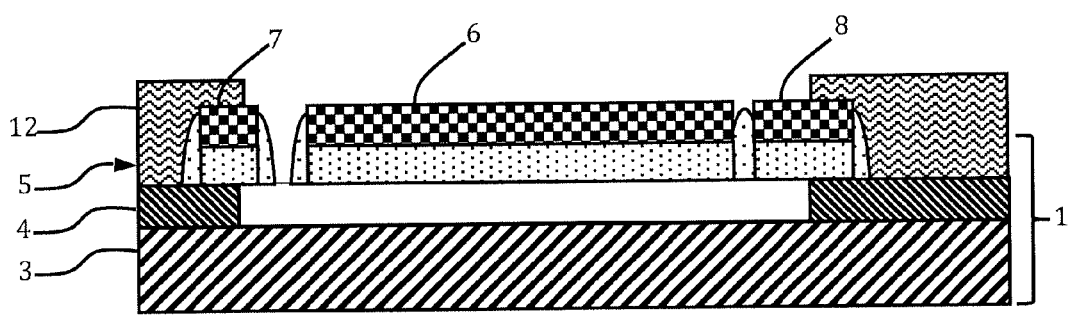

As illustrated in FIG. 6, layer 4 is partially etched so as to suspend at least a part of first pattern 6 and to define a cavity. Layer 4 is eliminated so as to suspend the future channel of the transistor. The bottom gate of the transistor will be formed in the cavity.

The etching is configured so that the part of the active area forming the channel remains suspended above the support. This configuration can be obtained in different manners, for example by means of lateral mechanical connections formed by lateral spacers 11 and possibly of the ends of pattern 6 formed in semiconductor material layer 5 which are still supported by layer 4.

Layer 4 is etched by any suitable technique. If layer 4 is formed by a silicon oxide, layer 4 can be etched by wet process by means of a hydrofluoric acid solution, by gaseous means with hydrofluoric acid in vapor phase or by a selective plasma comprising a $CF_3/CF_4$ mixture.

In an alternative embodiment, it is possible to deposit a layer, on first pattern 6, which acts as protection mask 12 and which covers and supports on layer 4. Protection mask 12 prevents the etching agent from coming into contact with layer 4 or from eliminating the whole of layer 4. For example, securing of the suspended active area is performed by means of a protection mask 12 formed by a resist or another material which can subsequently be selectively eliminated.

In a particular embodiment, the empty space which exists between first pattern 6 and second pattern 7 acts as sole aperture for input of an etching agent and/or output of the decomposition sub-product of the material forming layer 4.

Figure 7:
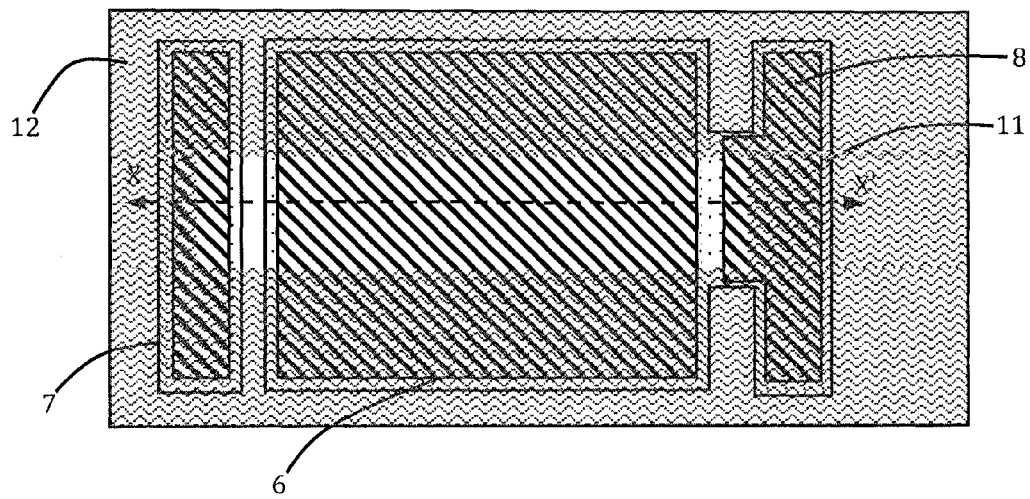
Figure 8:
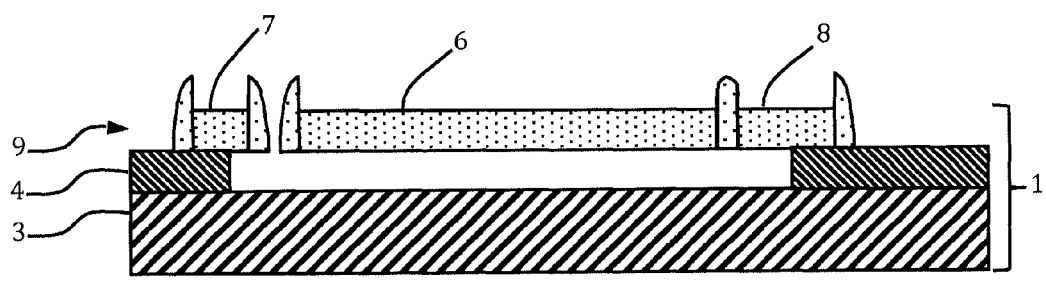

In advantageous manner as illustrated in FIGS. 6 and 7, a protection mask 12 is formed on substrate 1 so as to cover the main surface of substrate 1 and to leave a part of the space between first pattern 6 and second pattern 7 free to form a single access area to layer 4 of first material located facing first pattern 6. In a particularly advantageous embodiment, protection mask 12 defines the design of the area to be eliminated in layer 4. The design of mask 12 is used to define two different materials in layer 4 in order to facilitate selective etching between a new material and the material initially forming layer 4.

For example, protection mask 12 is used in an ion implantation step which modifies the material forming layer 4. This modified material is preferably etched with respect to the material initially forming layer 4 which enables the design of the future void area in layer 4 to be precisely defined.

Protection mask 12 is then eliminated.

First etching mask 2 is eliminated so as to free the top surface of first pattern 6 and advantageously the top surface of all the semiconductor material patterns originating from layer 5. Etching of mask 12 and of mask 2 can be performed by any suitable technique. After elimination of etching mask 2, lateral spacer 11 is salient above semiconductor material patterns 6, 7 and 8. In advantageous manner, etching mask 2 is eliminated in this step in order to facilitate extension of lateral spacer 11 above the semiconductor material pattern. In an alternative embodiment, etching mask 2 can be eliminated earlier in the method. It can also be envisaged to etch a part of layer 5 to make lateral spacer 11 salient.

An electrically insulating material (not shown) is then formed on the bottom surface and on the top surface of first semiconductor material pattern 6. The electrically insulating material is designed to form the gate dielectric of the future field-effect transistor both for the top gate and for the bottom gate. The gate dielectric is then formed, for example by oxidation of the semiconductor material originating from layer 5, but it is also possible to deposit the future gate dielectric.

In advantageous manner, the gate dielectric is deposited, in the cavity, on support 3 and on the side walls of the cavity defined by layer 4. For example, deposition of the gate dielectric can be performed by the CVD (Chemical Vapor Deposition) or ALD (Atomic Layer Deposition) techniques. Deposition of the gate dielectric on all the surfaces of the cavity enables the future bottom gate dielectric to be electrically insulated.

In a particular embodiment, the material of the gate dielectric is formed by oxidation of semiconductor material 5. This embodiment is particularly advantageous when the semiconductor material is made from silicon or silicon-base.

Elimination of first etching mask 2 associated with formation of the gate dielectric enables a volume to be delineated the bottom of which is defined by the gate dielectric and the lateral surfaces of which are defined by the lateral spacer.

Figure 9:
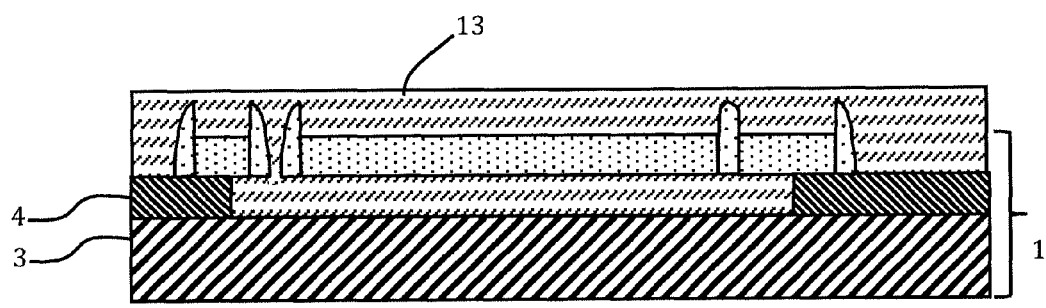

As illustrated in FIG. 9, a resist 13 is then deposited on the substrate. The deposition is configured so as to fill the cavity formed in layer 4. Resist 13 is photosensitive or sensitive to electronic radiation. It is also possible to fill the cavity and the top of the substrate separately with different chemical compounds which are advantageously sensitive to the same type of radiation.

Figure 10:
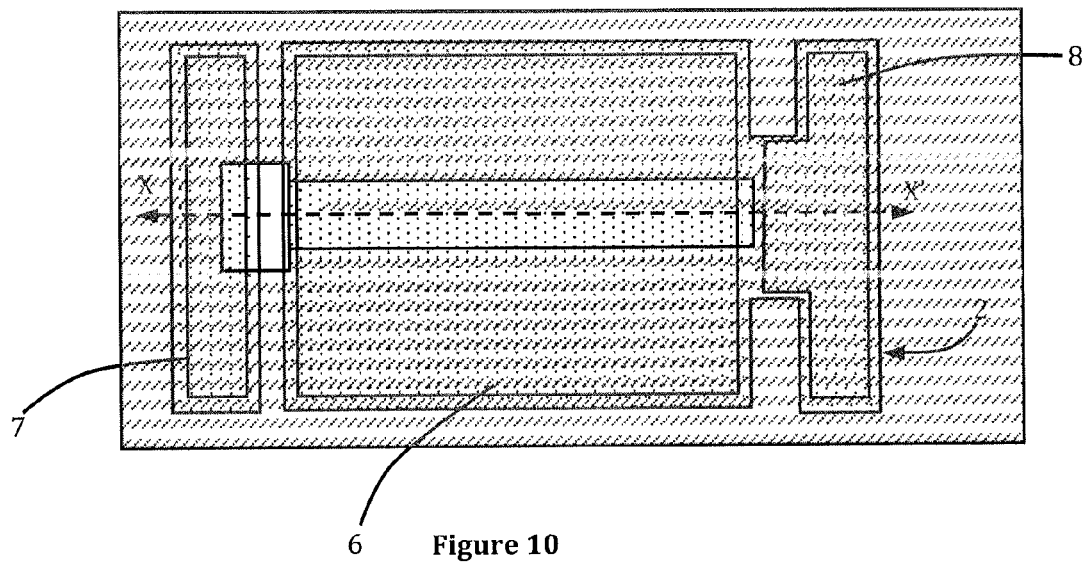

As illustrated in FIG. 10, exposure of resist 13 is performed so as to define the designs of the bottom and top gate electrodes. A first hole is formed in resist 13, inside the cavity, to define a future bottom gate. A second hole is formed in resist 13, on first pattern 6, to define a future top gate. Resist 13 leaves a part of the space existing between first pattern 6 and second pattern 7 free to access the hole representative of the bottom gate.

In advantageous manner, the two gates are defined in the same exposure step in order to have a self-alignment of the bottom gate with the top gate.

In a particular embodiment, exposure of the resins 13 arranged in the cavity and above semiconductor material layer 5 is performed by electronic radiation. It is also possible to perform exposure of the two future gates with a radiation of extreme UV type. The resist used can be of positive or negative polarity.

Resist 13 can be an HSQ resin, HSQ standing for Hydrogen SilsesQuioxane. It is also possible to use a resist of Fill type marketed by CEIMIG which is metal-based, for example with palladium. Once resist 13 has been exposed, the latter is developed in conventional manner to define the holes representative of the top and bottom gates.

If resist 13 is a positive resist comprising at least one metallic species, exposure of resist 13 forms the bottom and top gates. The use of such a resin, for example of CEIMIG type, enables the production method to be simplified as the resist forms the electrically conducting gates directly. Exposure of the resist at the same time achieves formation of the gate electrode made from electrically conducting material.

A part of resist 13 is then eliminated which defines the top and bottom gates, for example with holes representing the future gates.

Figure 11:
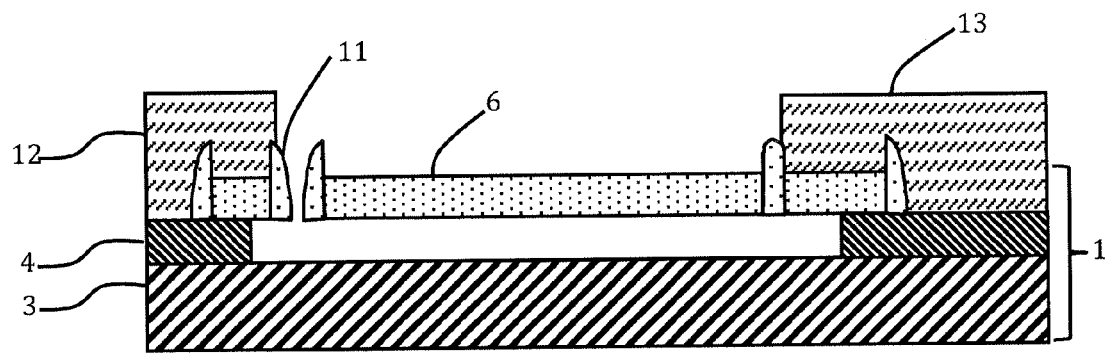

As illustrated in FIG. 11, development of resist 13 enables the shape of the top gate and of the bottom gate to be defined. At this time, it is possible to deposit the electrically conducting material forming the gate electrode. It is also possible to eliminate the gate dielectric and to replace it by a new gate dielectric.

In advantageous manner, resist 13 used is a negative resist in order to directly define the shape of the gates with a hole but it is also possible to use a positive resist in order to define the complementary shape of the gate and to then form the gate. It is further possible to form the gate directly.

Figure 12:
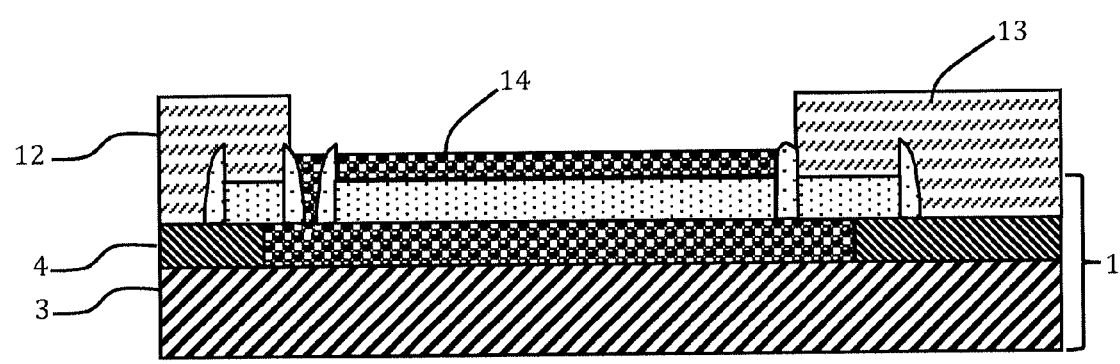

As illustrated in FIG. 12, an electrically conducting material 14 is then deposited in the cavity and on first pattern 6 to form the top gate and the bottom gate. The two gates are on each side of first semiconductor material pattern 6. The electrically conducting material is deposited in conformal manner in order to fill the cavity and prevent the formation of a void in the cavity as far as possible. The electrically conducting material is delineated by the pattern defined in resist 13 or by its complementary design depending on the polarity of resist 13 used.

In a preferred embodiment, the design of the gate extends onto second pattern 7 and/or onto pattern 8. Extension in the direction of third pattern 8 is performed on the part of lateral spacer 11 which connects first pattern 6 to third pattern 8. Extension in the direction of second pattern 7 is performed on the void which exists between lateral spacer 11 surrounding first pattern 6 and lateral spacer 11 surrounding third pattern 8.

This extension of the design of the gate onto one or both of the adjacent patterns enables a part of the constraints on the gate definition step to be relaxed. Indeed, if the gate design extends onto second pattern 7, there is no risk of short-circuiting as the gate dielectric has been deposited. The same is true if the gate design extends onto third pattern 8.

In a particularly advantageous embodiment, the gate design can extend onto one of the two patterns or onto both patterns in order to facilitate formation of the gate contact. In the case of a field-effect transistor comprising two electrically dissociated gate electrodes, it is advantageous to form the contact of the bottom gate on second pattern 7 and the contact of the top gate on third pattern 8.

In advantageous manner, once the cavity has been filled by electrically conducting material 14, the latter is partially etched so as to electrically dissociate the top gate electrode and the bottom gate electrode. Lateral spacer 11 surrounding first pattern 6 performs the electrical insulation between the two gate electrodes. The bottom gate is then electrically insulated from the top gate.

As illustrated in FIG. 12, partial etching of electrically conducting material 14 enables the electric connection which exists between the two gate electrodes to be eliminated. Partial etching of electrically conducting material 14 enables two electrically dissociated gate electrodes to be obtained. The top gate electrode is separated from the bottom gate electrode by lateral spacer 11. It is possible to simultaneously etch the electrically conducting material forming the top gate and the bottom gate. It is also possible to perform two different etchings to delineate the thickness of the top gate and of the contact of the bottom gate.

In advantageous manner, the material forming lateral spacer 11 is electrically insulating. If the latter is electrically conducting it is eliminated and then replaced by an electrically insulating material. Lateral spacer 11 has to be insulating in order to avoid short-circuiting between the channel made of semiconductor material channel and the gate electrode. Replacement of the material forming the lateral spacer can be performed in this step or later.

The rest of resist 13 is eliminated and the source and drain electrodes are then formed by implantation in semiconductor film 5 of first pattern 6 in conventional manner.

The remainder of the field-effect transistor formation method is conventional with contact connection advantageously preceded by silicidation of the source, drain and gate electrodes to reduce the access resistances.

Contact connection for the bottom gate is advantageously performed in the space between first pattern 6 and second pattern 7. Contact connection for the top gate is advantageously performed on the opposite side of the second pattern, i.e. in proximity to third pattern 8.

The invention claimed is:

1. A method for producing a double-gate field-effect device comprising the following successive steps:
   providing a substrate successively provided with a support, a first layer made from a first material, a second layer made from a semiconductor material and an etching mask, the second layer and the etching mask defining distinct first, second and third patterns on the first material,
   forming a lateral spacer surrounding each of the first, second and third patterns, the lateral spacer making the connection between the first and third patterns,
   eliminating the first layer so as to suspend at least a part of the first pattern and to define a cavity having an access opening between the first and second patterns,
   eliminating the first etching mask at least in the first, second and third patterns,
   forming a gate dielectric on two opposite main surfaces of the first pattern made from the second layer,
   depositing a resist in the cavity and on the first pattern made from the second layer,
   forming, in the resist, a first hole inside the cavity to define a future bottom gate and a second hole defining a future top gate on the first pattern,
   forming an electrically conducting material in the cavity and on the first pattern made from the second layer so as to form the bottom gate and the top gate separated by the first pattern made from the second layer.

2. The method according to claim 1, further comprising partial etching of the electrically conducting material to electrically insulate the bottom gate and the top gate.

3. The method according to claim 1, comprising conformal deposition of a spacer material and anisotropic etching of the spacer material to form the lateral spacer, a distance separating the first pattern and the third pattern being less than twice a width of the lateral spacer.

4. The method according to claim 1, wherein the resist fills the cavity and is arranged on the first pattern and an exposure step is performed for simultaneously defining the bottom gate and the top gate in the resist.

5. The method according to claim 1, further comprising forming a protection mask leaving a part of a space between the first pattern and the second pattern free to form a single access area to the first layer facing the first pattern.

6. The method according to claim 1, wherein the resist is a positive resist comprising at least one metallic species and exposure of the resist forms the bottom and top gates in exposed areas.

7. The method according to claim 1, wherein the resist is a negative resin, the resist leaving an access opening to the cavity situated between the first and second patterns free when exposure of the resist is performed.

* * * * *